(12) United States Patent
Nagahori

(10) Patent No.: US 8,714,666 B2
(45) Date of Patent: May 6, 2014

(54) CASING, MODULE SUBSTRATE, AND AIR-COOLING SYSTEM

(71) Applicant: Fujitsu Limited, Kawasaki (JP)

(72) Inventor: Kazuo Nagahori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/660,211

(22) Filed: Oct. 25, 2012

(65) Prior Publication Data

US 2013/0140968 A1  Jun. 6, 2013

Related U.S. Application Data

(63) Continuation of application No. PCT/JP2010/057684, filed on Apr. 30, 2010.

(51) Int. Cl.
*H05K 5/02* (2006.01)

(52) U.S. Cl.
USPC .......................................... 312/213; 312/236

(58) Field of Classification Search
USPC ............ 312/213, 223.1, 223.2, 236; 361/678, 361/692, 694, 688–690, 695, 361/679.46–679.54; 454/136, 184, 281, 454/318, 319; 49/74.1, 87.1, 90.1, 125, 61
See application file for complete search history.

(56) References Cited

U.S. PATENT DOCUMENTS

| | | | | |
|---|---|---|---|---|
| 3,188,937 A | * | 6/1965 | Mieczkowski | 454/343 |
| 4,361,861 A | * | 11/1982 | Spapens | 361/725 |
| 5,210,680 A | * | 5/1993 | Scheibler | 361/695 |
| 5,546,273 A | * | 8/1996 | Harris | 361/697 |
| 5,882,052 A | * | 3/1999 | Whitehead | 292/80 |
| 6,047,836 A | | 4/2000 | Miles | |
| 6,151,213 A | * | 11/2000 | Ater et al. | 361/695 |
| 6,483,700 B1 | * | 11/2002 | Malone et al. | 361/690 |
| 7,075,788 B2 | * | 7/2006 | Larson et al. | 361/695 |
| 7,152,418 B2 | * | 12/2006 | Alappat et al. | 62/186 |
| 7,227,751 B2 | * | 6/2007 | Robbins et al. | 361/695 |
| 7,316,606 B2 | * | 1/2008 | Shipley et al. | 454/184 |
| 7,394,654 B2 | * | 7/2008 | Zieman et al. | 361/695 |
| 8,373,987 B2 | * | 2/2013 | Kang et al. | 361/695 |
| 2003/0161118 A1 | * | 8/2003 | Bovell | 361/759 |
| 2004/0184233 A1 | | 9/2004 | Yamada | |
| 2005/0208888 A1 | * | 9/2005 | Moore et al. | 454/334 |
| 2006/0005555 A1 | * | 1/2006 | Alappat et al. | 62/186 |

FOREIGN PATENT DOCUMENTS

| | | |
|---|---|---|
| JP | 63-201390 | 12/1988 |
| JP | 2-4000 | 1/1990 |
| JP | 5-299861 | 11/1993 |
| JP | 6-164179 | 6/1994 |
| JP | 2004-252758 | 9/2004 |
| JP | 2007-73720 | 3/2007 |

OTHER PUBLICATIONS

International Search Report of PCT/JP2010/057684 mailed Jun. 1, 2010.

* cited by examiner

*Primary Examiner* — Janet M Wilkens
(74) *Attorney, Agent, or Firm* — Staas & Halsey LLP

(57) ABSTRACT

A casing in which a module substrate is to be enclosed, the casing includes a rail portion that slidably supports the module substrate, and a shutter portion provided so as to open and close an opening for ventilation. The casing includes a pin portion that is provided in the rail portion and contacts an edge of the module substrate while the module substrate is supported by the rail portion. The casing includes a link mechanism that allows the shutter portion to move in accordance with the moving distance of the pin portion.

10 Claims, 8 Drawing Sheets

US 8,714,666 B2

CASING, MODULE SUBSTRATE, AND AIR-COOLING SYSTEM

CROSS REFERENCE TO RELATED APPLICATIONS

This application is a continuation application of International Application PCT/JP2010/057684 filed on Apr. 30, 2010 in Japan, the entire contents of which are incorporated herein by reference

FIELD

The present case relates to an air-cooling system in a casing which is to contain a module substrate, a casing, and a module substrate.

BACKGROUND

Rack or sub-rack type casings for enclosing plug-in modules (module substrates) have been well known, as casings for electronic apparatuses that are compliant with standards, such as the Compact Peripheral Component Interconnect (Compact PCI), the Versa Module Eurocard (VME), and the Advanced Telecom Computing Architecture (ATCA).

Inside such a casing, multiple slots are provided in a row for attaching plug-in modules. Each slot is provided such that a rail for supporting an edge of a plug-in module extends perpendicular to the backplane, and plug-in module is attached or detached to the backplane by sliding the plug-in module on the rail.

A wide variety of types of plug-in modules are used. For example, a central processing unit (CPU) module, a storage module, a power supply module, and the like are used for a server apparatus or a disk array. For a network communication apparatus, interface modules and the like, which are compliant with a wide variety of communication standards, are used (see Patent Reference 1, for example).

A cooling fan for air-cooling plug-in modules and airflow openings formed in positions corresponding to the slots are provided in a casing. The cooling fan inhales the air from airflow openings defined in the bottom or sides of the casing, for example, and exhausts the air from the rear of the casing, thereby establishing the air flow that cools the plug-in modules. Another structure is also known wherein a shutter plate is provided for each airflow opening, and the airflow opening is opened only when a plug-in module is inserted in the slot. In this structure, the air-cooling efficiency can be increased while blocking undesired air flow since airflow openings corresponding to unused slots are closed by shutter plates and shutters are opened only for used slots (see Patent References 2 and 3, for example).

Patent Reference 1: Japanese Laid-open Patent Publication No. 2004-252758
Patent Reference 2: Japanese Laid-Open Patent Publication No. 05-299861
Patent Reference 3: Japanese Laid-Open Patent Publication No. 06-164179

Different plug-in modules generate different heat amounts. An ideal amount of air flow for some modules may be smaller than for other modules. However, since conventional air-cooling structures open and close airflow openings depending on whether the slots are used or not, without taking the amount of exhaust heat of each plug-in module into account, the air flow inside the casing as a whole is not well-balanced. As a result, the rotational speed of the cooling fan may be increased, in order to create sufficient air flow near a plug-in module generating the greatest amount of heat.

Alternatively, it is envisioned to adjust the air flow inside the casing by varying the rotational speeds of the individual cooling fans. However, such a technique uses complex structures and increases the cost. Sensors and control devices (such as a CPU and a memory) that controls the rotational speed of each cooling fan are expensive, since such sensors and control devices check the type and the amount of exhaust heat of each plug-in module. Further, the reliability remains low since other cooling fans are usually disposed to cool down the control devices, while the control devices are disposed for improving the cooling performance of the casing.

SUMMARY

According to an aspect of the embodiments, a casing in which a module substrate is to be enclosed, the casing including: a rail portion that slidably supports the module substrate; at least one shutter portion provided so as to open and close an opening for ventilation; a pin portion that is provided in the rail portion and contacts an edge of the module substrate while the module substrate is supported by the rail portion; and a link mechanism that moves (displaces, shifts) the shutter portion in accordance with the moving distance (amount of displacement, rotating angle) of the pin portion.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 5A-5C are side cross-sectional view illustrating the operation of the link mechanism in FIG. 4, wherein FIG. 5A illustrates the case where an air-passage hole is closed, FIG. 5B illustrates the case where the air-passage hole is opened, and FIG. 5C illustrates the case where the air-passage hole is partially opened;

FIGS. 10A and 10B are side cross-sectional view illustrating the link mechanism in FIG. 9, wherein FIG. 10A is a side cross-sectional view from the direction perpendicular to the rail (a view on "Arrow A" in FIG. 9), and FIG. 10B is a side cross-sectional view from the direction parallel to the rail (a view on "Arrow B" in FIG. 9).

DESCRIPTION OF EMBODIMENTS

Hereunder is a description of embodiments with reference to the drawings. Note that the embodiment described below is described by way of example only, and various modifications and applications of techniques that are not provided explicitly in the following embodiment are not intended to be excluded. That is, the present embodiments can be practiced in various ways (by combining the embodiments and the modifications, for example) without departing from the spirit thereof.

[1. Structural Overview]

Figure 1:
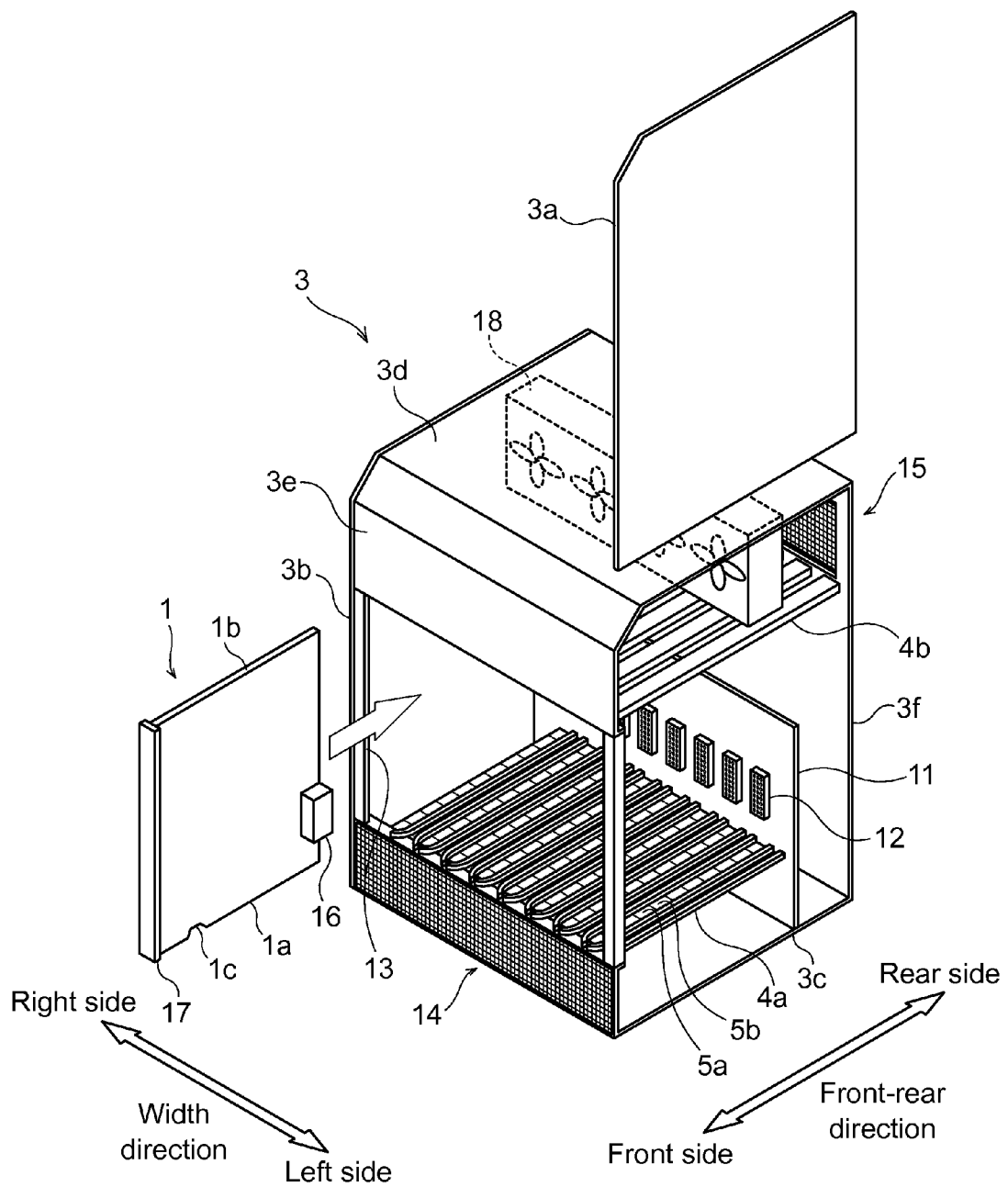
FIG. 1 is an exploded perspective view illustrating a casing and a module substrate in accordance with an embodiment.

FIG. 1 is a perspective view illustrating the structure of a plug-in module 1 (module substrate) and a casing 3 in accordance with an embodiment. The casing 3 is an approximate cubic box-shaped case for electronic apparatuses, and is capable of receiving multiple plug-in modules 1. The casing 3 includes a left side plate 3a, a right side plate 3b, a bottom plate 3c, a top plate 3d, a front plate 3e, and the rear plate 3f, on the six faces thereof. Among these plates, the left side plate 3a, the right side plate 3b, the bottom plate 3c, and the top plate 3d respectively cover the left side, right side, bottom, and the top of the casing 3.

On the front plate 3e, an opening 13 that allows attachment of the plug-in module 1 into the casing 3, and a front airflow opening 14 for air intake, are provided. The opening 13 is provided in a rectangular shape, substantially across the entire width of the casing 3. The front airflow opening 14 is provided so as to extend substantially across the entire width of the casing 3, adjacently below the opening 13. A rear airflow opening 15 for air exhaust is provided in the rear plate 3f. The rear airflow opening 15 extends substantially across the entire width of the rear plate 3f at the top thereof (at upper section of thereof).

The inner space of the casing 3 is divided into front and rear compartments of the casing 3 by a backplane 11 that is provided so as to stand approximately perpendicularly from the bottom plate 3c. The backplane 11 is a printed board having a number of connectors 12. The connectors 12 are to be connected to the plug-in module 1 in the casing 3 for establishing buses with the plug-in module 1 connected to the connectors 12. A power supply unit (not illustrated) is provided on the rear side of the backplane 11 which supplies electric power to the plug-in module 1 through one of the connectors 12.

A cooling fan unit 18 is provided on the front side of the rear airflow opening 15 in the casing 3. The cooling fan unit 18 is an air blower that inhales the air from the front side thereof and exhales the air from the rear side. Thereby, the air flow (flow of the air) is established, wherein the air is introduced from the front airflow opening 14 into the casing 3, and the air blown by the cooling fan unit 18 is exhausted from the rear airflow opening 15.

[2. Rails]

Between the bottom of the opening 13 provided on the front of the casing 3 and the backplane 11, multiple rails 4a (rail portion) extending straight in the front-rear direction of the casing 3 are secured to the bottom plate 3c such that the rails 4a extend parallel to the bottom plate 3c. The rails 4a are arranged with a predetermined spacing (certain spacing) defined from each other, in the width direction of the casing 3. The rails 4a are provided in positions corresponding to the respective connectors 12 provided in the backplane 11, each of which defines a single slot. The rail 4a can support the plug-in module 1 slidably.

Figure 2:
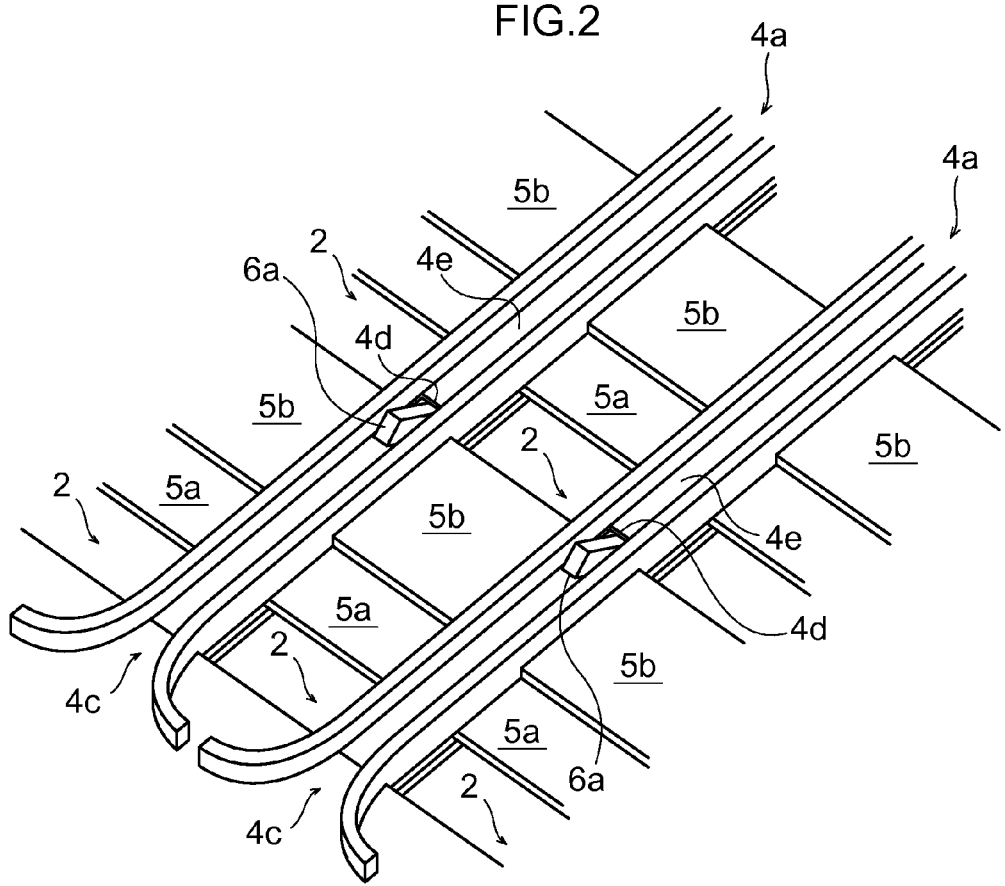
FIG. 2 is a perspective view illustrating rails in the casing in FIG. 1 in an enlarged view.

As depicted in FIG. 2, multiple plate-shaped shutter portions 5a and multiple fixing plates 5b are provided between two adjacent rails 4a. The multiple fixing plates 5b are spaced apart from each other in the direction of the extension of the rails 4a, and secured adjacent to the rails 4a. The spacing between the fixing plates 5b defines the air-passage holes 2 that connect the space above the rails 4a to the space below the rails 4a. The multiple shutter portions 5a are provided so as to be slidable with respect to the fixing plates 5b. The multiple shutter portions 5a are provided so as to open and close the air-passage holes 2 for ventilation. The shutter portions 5a are slid by a link mechanism 10, which will be described later. The shutter plates 5a slide in the direction of the extension of the rails 4a.

As depicted in FIG. 1, between the top of the opening 13 and the rear plate 3f, multiple upper rails 4b are secured corresponding to the respective rails 4a, so as to be paired with the rails 4a. The upper rails 4b are provided in the same number as the number of the rails 4a, and the upper rails 4b are provided in parallel, directly above the rails 4a. Hence, the upper rails 4b are arranged with a predetermined spacing (certain spacing) defined therebetween in the width direction of the casing 3, and extend straight in the front-rear direction of the casing 3. A single rail 4a and the upper rail 4b right above the rail 4a function as a guide that guides (leads) one plug-in module 1 into the casing 3.

As depicted in FIG. 2, groove-shaped concave portions 4c are formed near the center of the left-right direction of the rails 4a (the width direction of the casing 3). That is, the rail 4a linearly extends and is formed in a groove shape. The concave portions 4c extend straight in the front-rear direction of the casing 3. The width of the front edge of each concave portion 4c in the casing 3 is enhanced (increases) so as to facilitate attachment of a plug-in module 1. A pin hole 4d is perforated in the bottom 4e of the concave portions 4c. The pin hole 4d is an opening through which a pin portion 6a (pin) of a connector portion 6 is to be protruded upwardly from the bottom 4e of the concave portion 4c. What it comes down to is, pin portion 6a protrudes from an inside of the groove-shaped rail 4a toward a concave portion 4c. Further details about the connector portion 6 will be described later.

[3. Plug-in Module]

A plug-in module 1 is a module substrate of plug-in-type to be connected to a connector 12. The plug-in module 1 includes a wide variety of electronic components, electronic devices, and the like, on a substrate. A board connector 16 to be connected to a connectors 12 is provided on one edge of the plug-in module 1 which is located inside once the plug-in module 1 is mounted in the casing 3, and a front panel 17 is secured to the edge which is to be located on the front of the casing 3. The bottom edge 1a of the plug-in module 1 is slidably supported on a rail 4a, and the upper edge 1b of the plug-in module 1 is slidably supported on an upper rail 4b.

Figure 3:
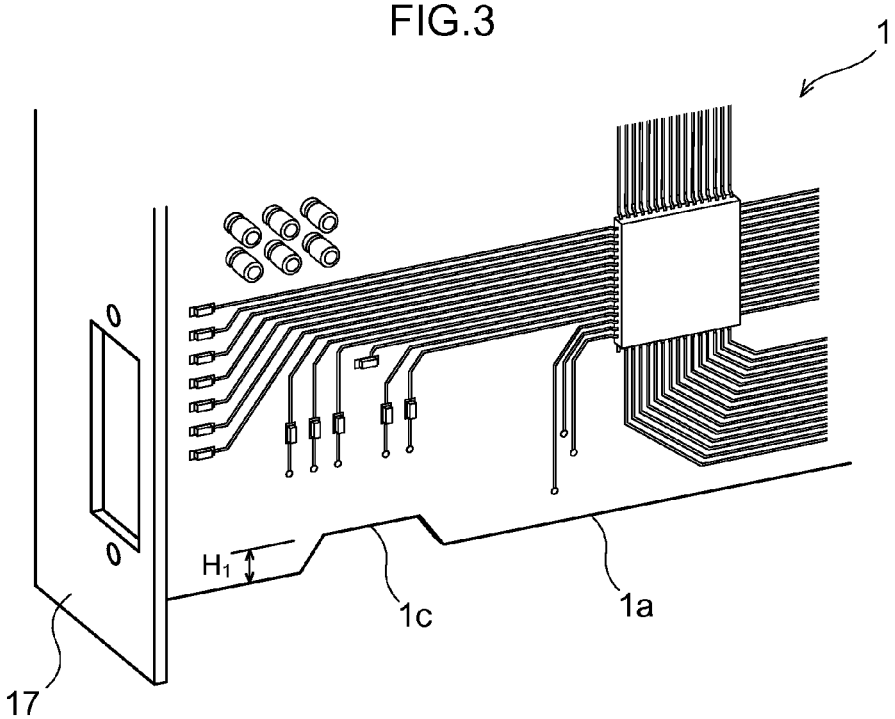
FIG. 3 is a perspective view illustrating the main portion of a plug-in module to be inserted (mounted) into the casing in FIG. 1 in an enlarged view.

As depicted in FIG. 3, a recess 1c is formed in the bottom edge 1a of the plug-in module 1 by cutting away the bottom edge 1a toward the upper edge 1b. Here, the depth of the recess 1c (the size in the direction perpendicular to the bottom edge 1a) is represented by H1.

Note that the depth of the recess 1c corresponds to the moving distance of a shutter portion 5a, which will be described later. Further, recesses 1c are not provided to all of the plug-in modules 1 to be mounted in the casing 3, and some plug-in modules 1 are provided with recesses 1c. For example, a plug-in module 1 having an electronic component or an electronic device that generates a relatively greater amount of exhaust heat (e.g., central processing units) can omit a recess 1c.

The location of the recess 1c corresponds to a pin portion 6a which will be described later, and is the position directly above the pin hole 4d on the rail 4a when the connector 12 is connected to the board connector 16. The recess 1c contacts with the pin portion 6a when the plug-in module 1 is inserted and supported on the rail 4a. The recess 1c has a function to adjust the moving distance of the pin portion 6a.

[4. Link Mechanism]

Figure 4:
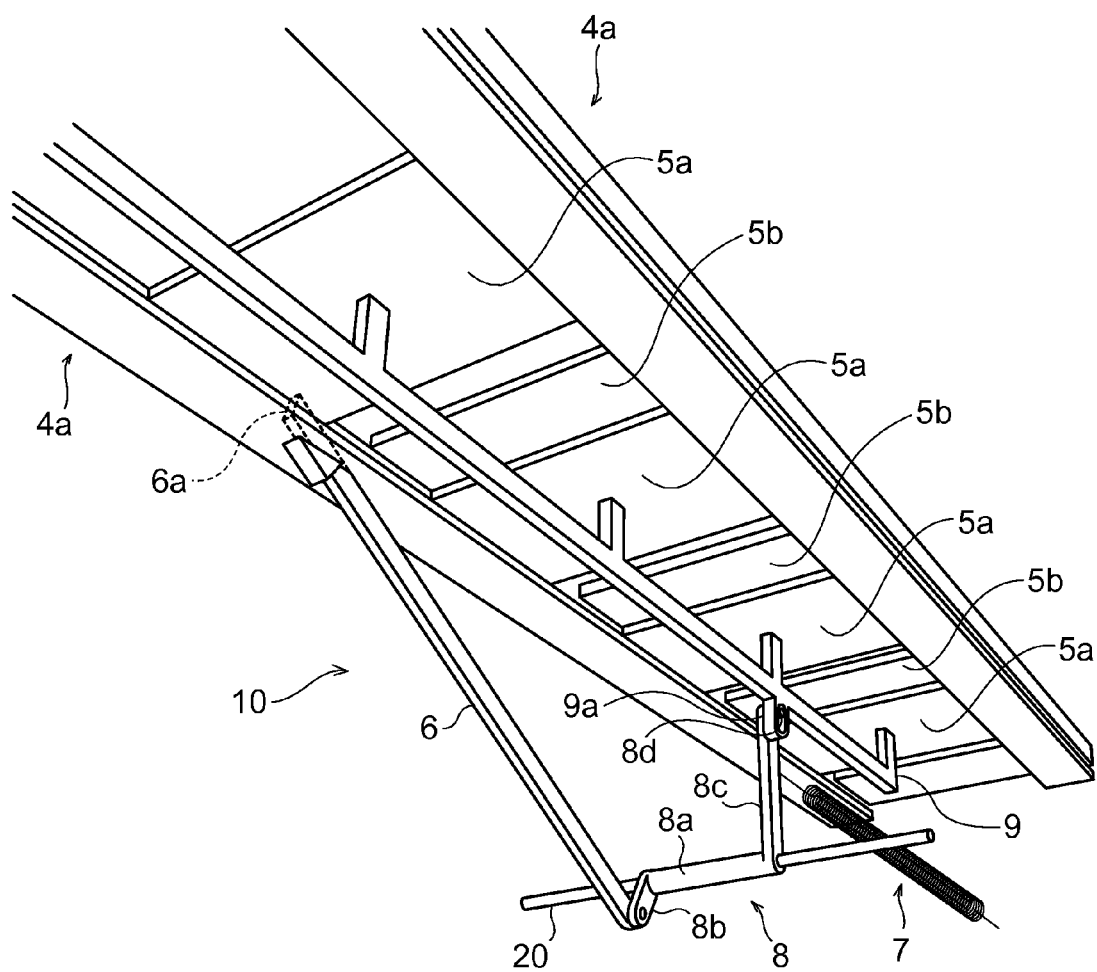
FIG. 4 is a perspective view illustrating a link mechanism in the casing in FIG. 1.
Figure 5A:
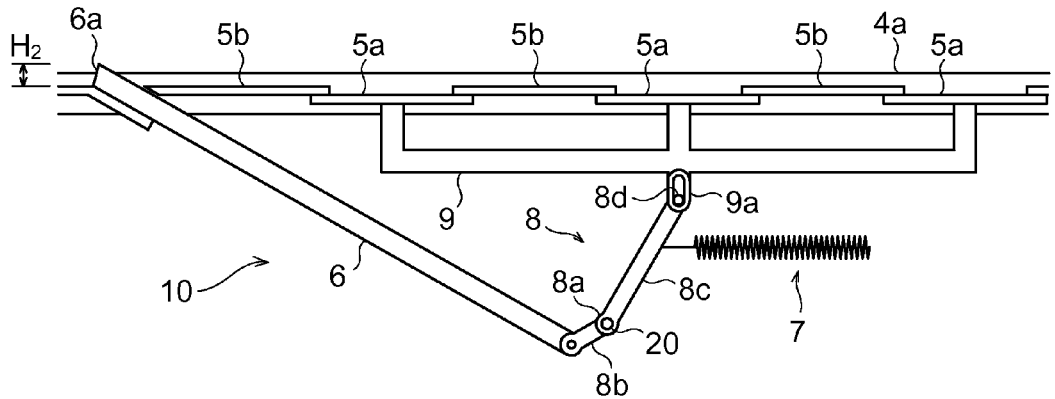

As depicted in FIG. 4 and FIG. 5A, a link mechanism 10 to open and close the shutter portion 5a is provided under the rail 4a. The link mechanism 10 allows the shutter portion 5a to move in accordance with the moving distance of the pin portion 6a. The pin portion 6a and the link mechanism 10 are provided at a plurality of positions along a direction where the rail 4a extends. Each of the pin portions 6a and the link mechanisms 10 drive different shutter portion 5a. The link mechanism 10 includes a connector portion 6, a spring 7, a lever portion 8, and a drive portion 9.

The lever portion 8 is a member that swings about a rotational shaft 20 secured to the casing 3. The rotational shaft 20 is secured to the casing 3 via a securing structure which is not illustrated. The lever portion 8 includes a shaft portion 8a that slidably surrounds the periphery of the rotational shaft 20, and a first lever portion 8b and a second lever portion 8c. Both of the first lever portion 8b and the second lever portion 8c are secured to the shaft portion 8a. The first lever portion 8b and the second lever portion 8c are members provided so as to extend in the direction perpendicular to the rotational shaft 20 (i.e., in the radial direction).

The first lever portion 8b is shorter than the second lever portion 8c. In other words, when the lever portion 8 rotates about the rotational shaft 20, the trajectory (locus) of an end of the first lever portion 8b (end of the lever portion 8) has a smaller radius than the radius of the trajectory of an end of the second lever portion 8c (the second end of the lever portion 8). Accordingly, the moving distance (the length of an arc) of the second lever portion 8c is greater than the moving distance of the first lever portion 8b. Note that the ratio of the moving distance of the second lever portion 8c to the moving distance of the first lever portion 8b is proportional to the ratio of the length of the second lever portion 8c to the length of the first lever portion 8b.

The rod-shaped connector portion 6 is linked to the first lever portion 8b by means of pin coupling. Hereinafter, the end of the connector portion 6 which is not connected to the first lever portion 8b is referred to as a pin portion 6a. As depicted in FIG. 2, the pin portion 6a is provided in the rail 4a so as to protrude upward from the pin hole 4d perforated through the bottom 4e of the concave portion 4c. The connector portion 6 as a whole is downwardly pushed and the first lever portion 8b rotates, in response to the bottom edge 1a of the plug-in module 1 being made contact with the pin portion 6a while the plug-in module 1 is supported on the rails 4a. In other words, pin portion 6a is provided in the rail 4a and contacts an edge of the plug-in modules 1 while the plug-in modules 1 is supported on the rail 4a. The connector portion 6 links a first end of the lever portion 8 to the pin portion 6a, and rotates the lever portion 8 in accordance with the moving distance of the pin portion 6a.

A horizontal pin 8d is provided so as to protrude at the end of the second lever portion 8c. The lower end of the drive portion 9 is connected to the second lever portion 8c via a horizontal pin 8d and slider portion 9a. The direction where the horizontal pin 8d protrudes corresponds to the direction where the direction where the rotational shaft 20 extends. The slider portion 9a is shaped into a hollow cylinder perpendicularly elongated and surrounding the horizontal pin 8d, and links the second lever portion 8c to the drive portion 9 while allowing the horizontal pin 8d to be moved and rotated in the perpendicular direction. Further, the top of the drive portion 9 is divided into several sections, which are respectively fixed to the shutter portions 5a. The drive portion 9 links a second end of the lever portion 8 to the shutter portion 5a. The drive portion 9 drives (displaces, shifts, move) the shutter portion 5a in accordance with the amount of rotation of the lever portion 8. The shutter portion 5a is provided so as to be slidable with respect to the opening for ventilation. The drive portion 9 comprises a slider portion 9a that transfers the moving distance in a slide direction among the amount of rotation of the lever portion 8 to the shutter portion 5a.

6] In other words, the slider portion 9a transfers the moving distance in the slide direction, out of the amount of rotation of the lever portion 8, to the shutter portions 5a. Thereby, the entire drive portion 9 moves horizontally, in response to the motion of the horizontal pin 8d, and allows the shutter portions 5a to move along the direction of the extension of the rails 4a. The moving distance of the shutter portion 5a depends on the moving distance of the horizontal pin 8d, accordingly depends on the moving distance of the connector portion 6. Accordingly, the moving distance when the pin portion 6a abuts against the bottom edge 1a of the plug-in module 1 and is pushed downwardly determines the opening area (the degree of opening) of the air-passage holes 2.

The spring 7 is an elastic member that presses the lever portion 8 and the drive portion 9 to the direction such that the shutter portions 5a close the air-passage holes 2. Here, an example is explained wherein one end of a coil spring is secured to the second lever portion 8c, and other end of the coil spring is extended to a certain position (not illustrated) in the casing 3 and is fixed thereto. Note that the spring 7 may be enclosed in the shaft portion 8a such that the lever portion 8 is shifted in the right rotational direction (clockwise direction) with respect to the rotational shaft 20 in FIG. 5A.

As depicted in FIG. 5A, the amount of protrusion of the pin portion 6a protruded from the bottom 4e of the concave portion 4c when the air-passage holes 2 is closed in response to the shift of the spring 7 is H2 (That is, the size in the direction perpendicular to the bottom surface of the concave portions 4c is H2). In this embodiment, the size H2 is equal to or greater than the size H1 (H1≤H2).

[5. Operation and Effects]

As depicted in FIG. 5A, when no plug-in module 1 is inserted in a rail 4a, the pin portion 6a protrudes from the bottom 4e and the air-passage holes 2 are closed. Accordingly, no air flows near the slot which is not used.

Figure 5B:
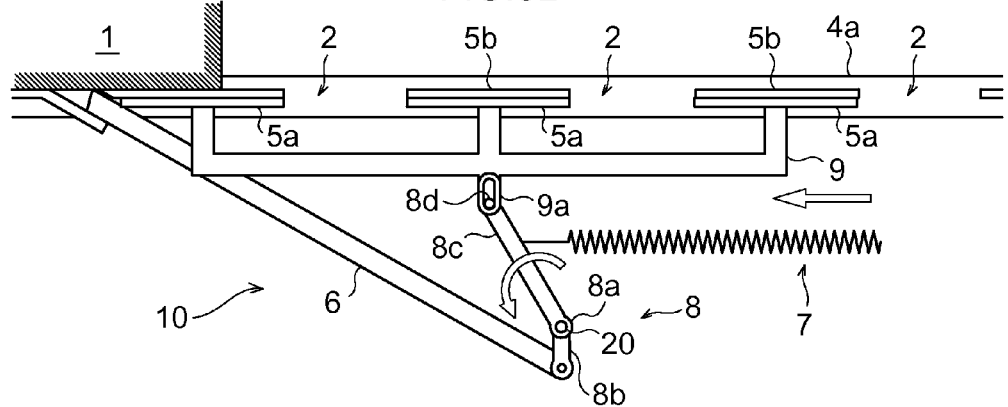

As depicted in FIG. 5B, when a plug-in module 1 is inserted in a rail 4a, the pin portion 6a abuts against the bottom edge 1a of the plug-in module 1 and the entire connector portion 6 is pushed downward. Thereby, the first lever portion 8b rotates in the left rotational direction (anticlockwise direction), and the second lever portion 8c also rotates about the rotational shaft 20 in the anticlockwise direction.

At this time, the moving distance of the end of the second lever portion 8c is an amplified moving distance of the first lever portion 8b, and the drive portion 9 moves in a greater distance in the horizontal left direction. At the same time, the shutter portions 5a fixed to the top of the drive portion 9 also move in the horizontal left direction and the air-passage holes 2 are opened. Accordingly, an air flow is established near the slot which is used.

Figure 5C:
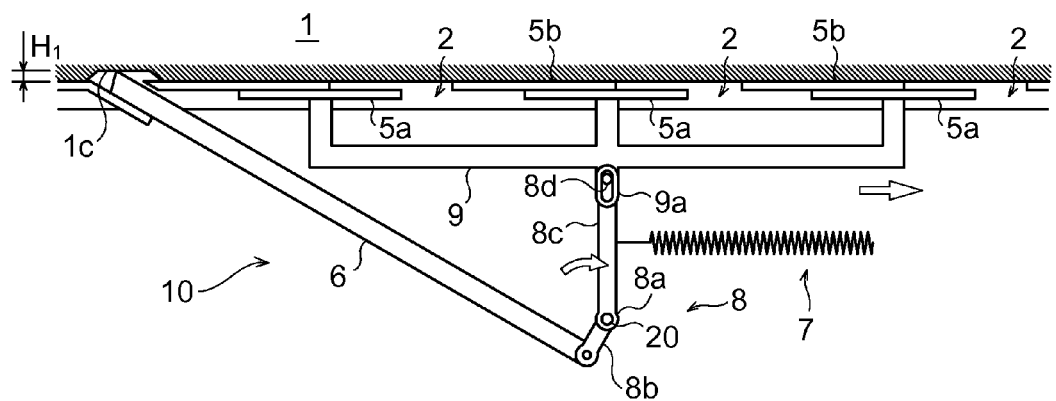

As depicted in FIG. 5C, when the plug-in module 1 is pushed further to connect the board connector 16 to the connector 12, the pin portion 6a engages with the recess 1c. At this time, the lever portion 8 rotates in the right rotational direction by the action of the spring 7, and the entire connector portion 6 is pushed back upward. Thereby, the pin portion 6a protrudes from the bottom 4e, although the degree of the protrusion is smaller than that when no plug-in module 1 is inserted in.

Further, the drive portion 9 and the shutter portions 5a also move in the horizontal right direction, and the air-passage holes 2 could be half-opened. The amount of the air flowing through the air-passage holes 2 depends on the opening area of the air-passage holes 2. Accordingly, the open area of the air-passage holes 2 can be varied by changing and adjusting the depth H1 of the recess 1*c* to adjust the moving distance of the shutter portion 5*a*. Therefore, the amount of the air flowing can be regulated.

For example, in the case of a plug-in module 1 with a small amount of exhaust heat, the air-passage holes 2 are not opened entirely, rather than being fully opened, by increasing the depth of the recess 1*c*. In other words, the open area can be reduced to reduce the amount of the air circulating around the plug-in module 1. Thereby, more air can be provided as the air circulating around other plug-in module 1 to establish suitable air flow inside the casing 3.

Further, the air-passage holes 2 can be fully closed by increasing the depth of the recess 1*c* further, even when a plug-in module 1 is mounted.

Further, since the shutter portions 5*a* slide in response to a physical contact between the pin portion 6*a* for the link mechanism 10 and the recess 1*c* in the plug-in module 1, the operation is quite reliable and the structure does not thermally affect on the casing 3. Further, the simplified structure contributes to cost reduction. The link mechanism 10 has a structure wherein the shutter portions 5*a* are horizontally slid, which is also advantageous in that the amount of protrusion toward the air-passage holes 2 in the vertical direction can be reduced.

As described above, the disclosed technique can modify the open area of the air-passage holes 2 by varying the depth of a recess 1*c* to provide sufficient air flow with a simplified structure.

[6. Modifications]

Modifications will be described below, wherein elements same as those in the above-described embodiment will be denoted by the same reference symbols and descriptions therefor will be omitted.

[6-1. Variant with Multiple Link Mechanisms]

Figure 6:
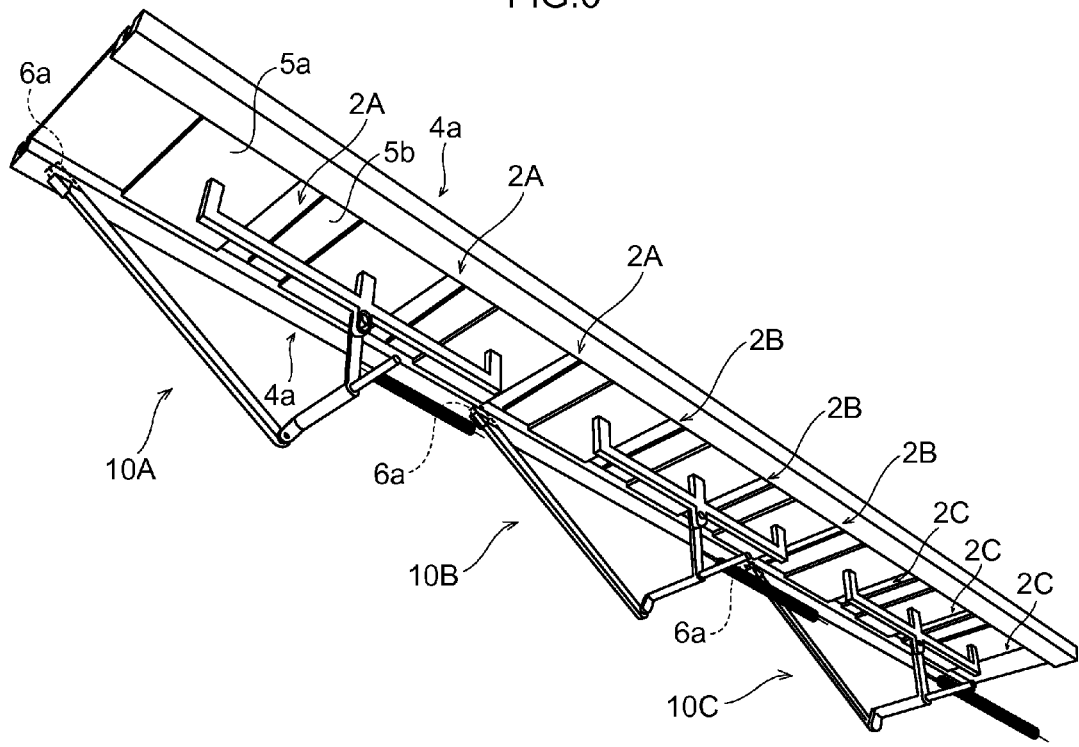
FIG. 6 is a perspective view illustrating a link mechanism in a casing as a modification.
Figure 7:
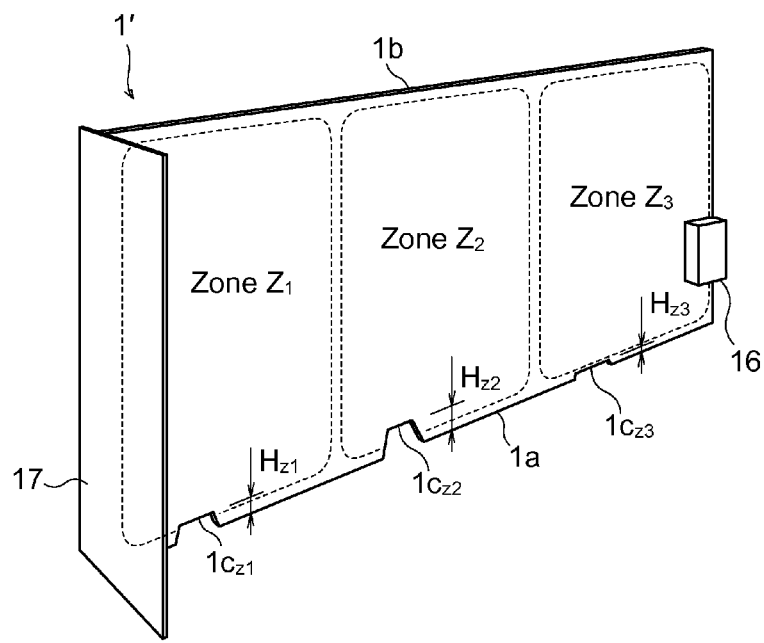
FIG. 7 is a perspective view illustrating a plug-in module for the modification in FIG. 6.

FIG. 6 depicts multiple link mechanisms arranged in the direction of the extension of the rails 4*a*. Here, pin portions 6*a* of the link mechanisms are disposed at three points, namely, in the front, the middle, and the rear of the casing 3, in the direction of the extension of the rails 4*a*. Hereinafter, the link mechanisms are referred to as a first link mechanism 10A, s second link mechanism 10B, and a third link mechanism 10C, in this order, from the front of the casing 3. A plug-in module 1' depicted in FIG. 7 is to be inserted into the casing 3.

Here, for the sake of illustrational purposes, the surface of the board is divided into three zones, in accordance with the types of electronic components or electronic devices mounted on the plug-in module 1'. Hereinafter, as depicted in FIG. 7, these three zones are referred to as a first zone Z1, a second zone Z2, and a third zone Z3, in this order, from the front of the casing 3.

The first zone Z1 is the zone on which electronic components and electronic devices generating a relatively smaller amount of exhaust heat are placed. The second zone Z2 is the zone on which only electronic circuits generating substantially no heat are placed. The third zone Z3 is the zone on which electronic components and electronic devices radiating a relatively greater amount of exhaust heat (e.g., central processing unit) are placed.

The first link mechanism 10A has a function to define the open area of the air-passage holes 2A located under the first zone Z1 once a board connector 16 of a plug-in module 1' is connected to a connector 12 of the casing 3. Similarly, the second link mechanism 10B defines the open area of the air-passage holes 2B that corresponds to the second zone Z2, and the third link mechanism 10C defines the open area of the air-passage holes 2C that corresponds to the third zone Z3.

Recesses 1*cz*1, 1*cz*2 and 1*cz*3, each of which has a different depth, are formed in the respective zones Z1, Z2 and Z3 of the plug-in module 1', for the purpose of setting the moving distance of the shutter portions 5*a* by the corresponding link mechanisms 10A, 10B and 10C. The recess 1*cz*1 is formed at the position corresponding to the pin portion 6*a* of the link mechanism 10A. Similarly, the recesses 1*cz*2 and 1*cz*3 are formed at the positions corresponding to the pin portions 6*a* of the link mechanisms 10B and 10C, respectively.

As depicted in FIG. 7, the depths Hz1, Hz2, and Hz3 of the recesses 1*c* in the zones Z1, Z2, and Z3 are set so as to satisfy the following inequity, for example:

$$0 \leq Hz3 < Hz1 < Hz2 (\leq H2)$$

That is, the smaller the depth of the recess 1*c* becomes, the greater the amount of exhaust heat is. Here, all of the depths of the recess 1*c* are set to be equal to or smaller than the size H2 since the shutter portions 5*a* do not move (the air-passage holes 2 remain closed) even if the depth of the recess 1*c* is greater than the size H2. That is, if it is desired to remain the air-passage holes 2 closed, the depth of the recess 1*c* is set to be equal to or greater than the size H2.

Figure 8:
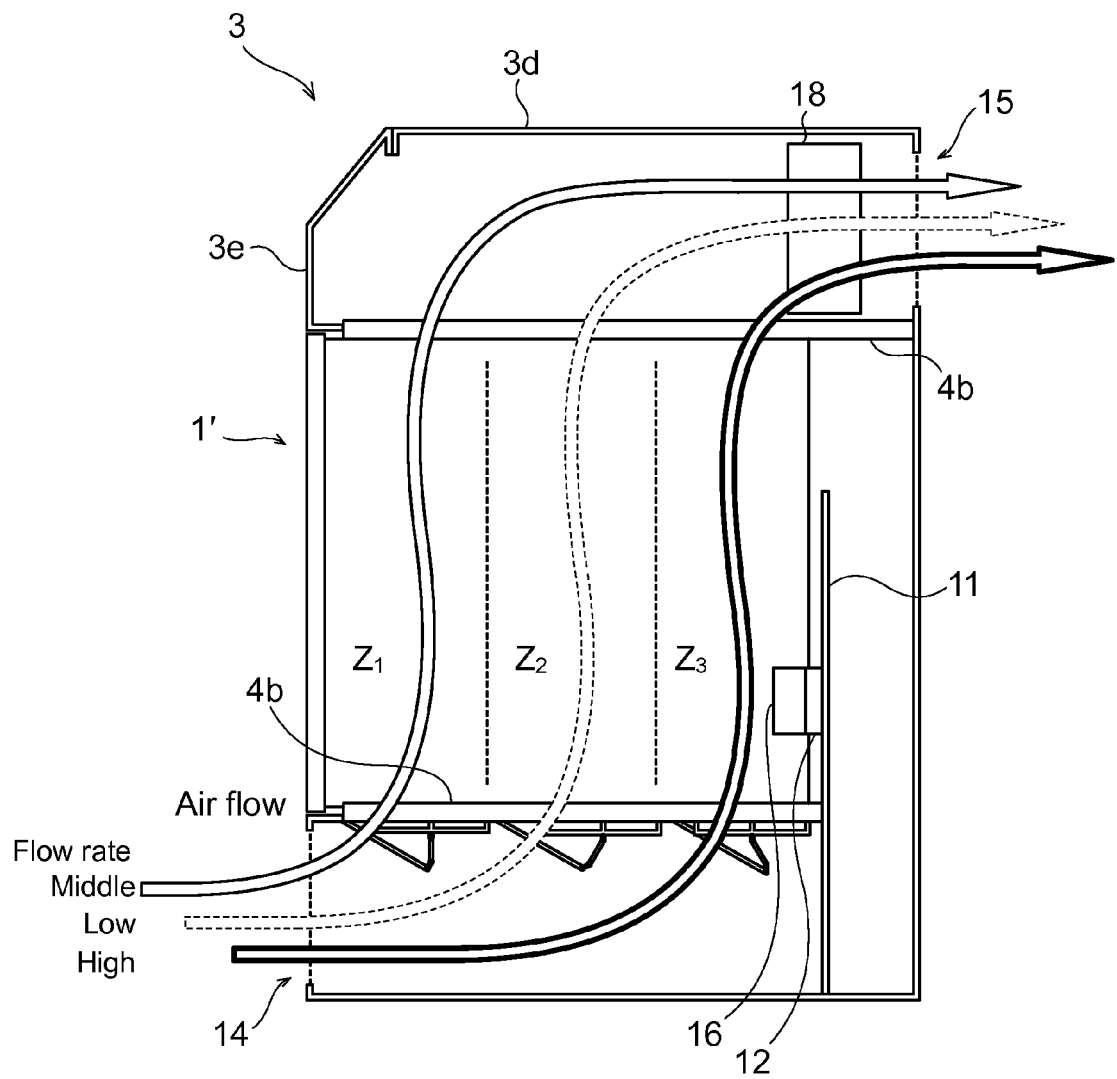
FIG. 8 is a side cross-sectional view schematically illustrating air flows in the modification in FIG. 6.

When such a plug-in module 1' is attached in the casing 3, as depicted in FIG. 8, the air-passage holes 2 located under the zone Z3 are opened wide, the air-passage holes 2 located under the zone Z1 are opened relatively wider, and the air-passage holes 2 located under the zone Z2 are opened the narrowest. Thereby, the opening areas of the air-passage holes 2 can be varied in the direction of the extension of the rails 4*a*, and the distribution of amount of the air flowing inside the casing 3 can be varied for various locations of the plug-in module 1'. Accordingly, the amount of the air passing near the zone Z3 that generates a relatively greater amount of exhaust heat can be increased greater than the other zones Z1 and Z2, and the air-cooling efficiency can be improved.

[6-2. Variant with Different Link Mechanism]

Figure 9:
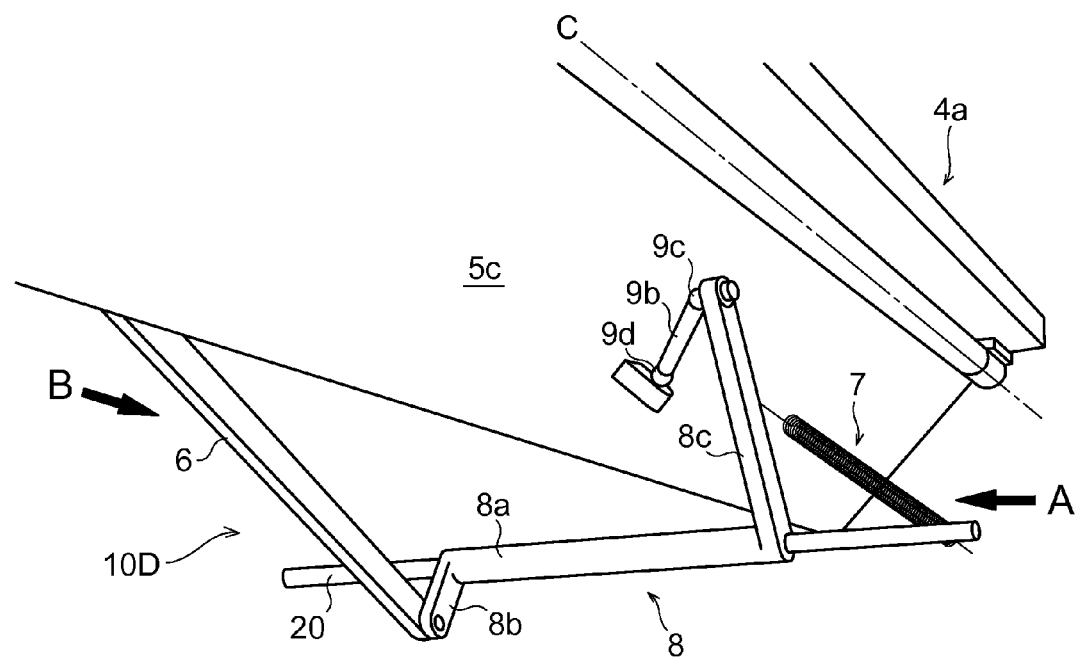
FIG. 9 is a perspective view illustrating a link mechanism in a casing as a modification.

The above-described embodiment employs the link mechanism 10 wherein the lever portion 8 is rotated in accordance with the moving distance of the pin portion 6*a*, and a rotational motion of the lever portion 8 is converted into a horizontal motion of the drive portion 9 to open the air-passage holes 2. However, a link mechanism is not limited to this. For example, as depicted in FIG. 9 and FIGS. 10A and 10B, a link mechanism 10D may be used wherein a rotational motion of the lever portion 8 is converted into a rotational motion of a different direction to open the air-passage holes 2.

In this case, it is envisioned that a second connector portion 9*b* having a function as another drive portion 9 may be connected to an end of the second lever portion 8*c* of the lever portion 8. The second connector portion 9*b* is a rod-shaped member having a certain length. A universal joint 9*c* is disposed between the end of the second lever portion 8*c* and the one end of the second connector portion 9*b*. Further, a universal joint 9*d* is disposed between the other end of a second connector portion 9*b* and a shutter portion 5*c*. The shutter portion 5*c* is provided so as to be rotatable about a shutter rotational shaft C that is provided at one side of the opening for ventilation. The shutter portion 5*c* is provided to be parallel to the direction of the extension of the rails 4*a*. What it comes down to is, the drive portion 9 comprises the second connector portion 9*b* that rotates the shutter portion 5*c*, and a pair of universal joints 9*c* provided at both ends of the second connector portion 9*b*.

Figure 10A:
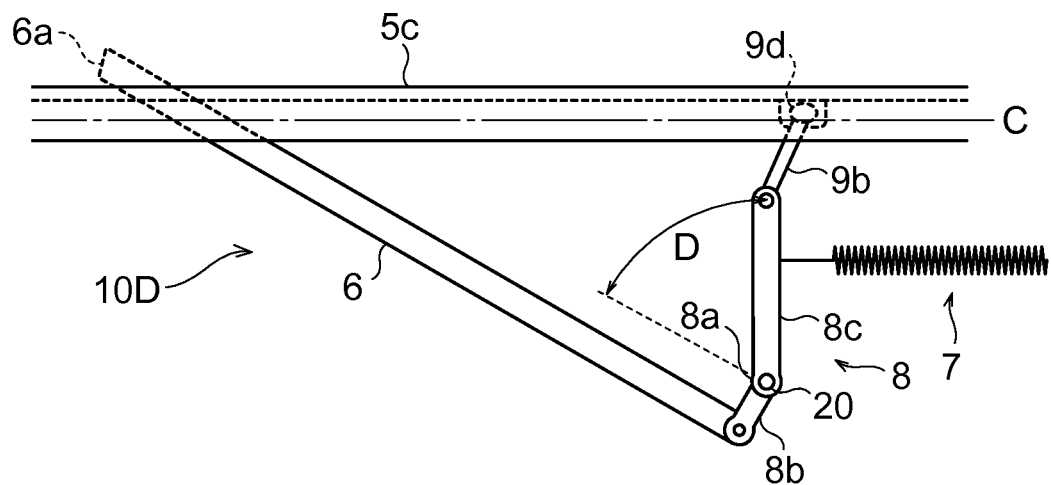

As depicted in FIG. 10A, the end of the second lever portion 8c swings in the direction of Arrow D in the plane parallel to the shutter rotational shaft C and perpendicular to the ground, in accordance with the motion of the connector portion 6. Accordingly, the trajectory of the universal joint 9c at the one end of the second connector portion 9b is limited within the plane parallel to the shutter rotational shaft C and perpendicular to the ground.

Figure 10B:
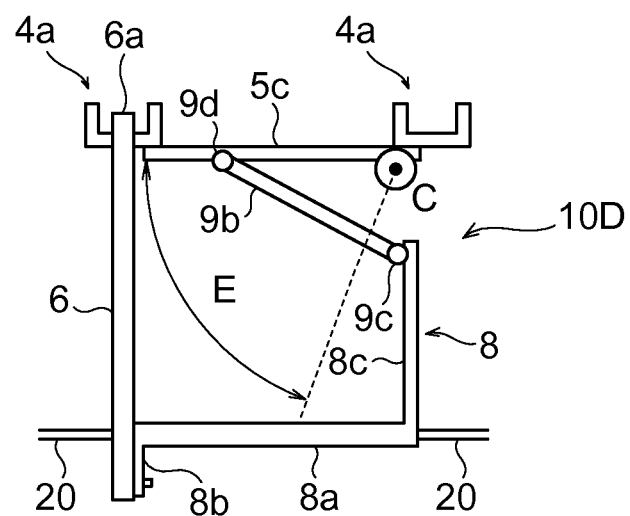

On the other hand, as depicted in FIG. 10B, the shutter portion 5c swings in the direction of Arrow E about the shutter rotational shaft C. Accordingly, the trajectory of the universal joint 9d at the other end of the second connector portion 9b is limited within the plane perpendicular to the shutter rotational shaft C.

The second connector portion 9b allows the other universal joint 9d to move within the plane perpendicular to the shutter rotational shaft C while varying the angle such that the distance between the universal joint 9c and the other universal joint 9d remains constant, when the universal joint 9c moves within the plane parallel to the shutter rotational shaft C and perpendicular to the ground. Accordingly, the shutter portion 5c can be opened in accordance with the amount of rotation of the lever portion 8 by setting a movable direction of the universal joint 9c to the direction so as to increase the distance from the position of the universal joint 9d while the shutter portion 5c closes the air-passage holes 2.

This link mechanism 10D is advantageous in that the ratio of opening area of the air-passage holes 2 can be easily increased since the shutter portion 5c is rotated about the shutter rotational shaft C which is parallel to the direction of the extension of the rails 4a.

[6-3. Miscellaneous]

Although the link mechanisms for operating the shutter portions 5a and 5c that open and close the air-passage holes 2 under the plug-in module 1 have been described in the above-described embodiment and modifications thereof, the location for varying the opening area for air passage is not limited to them. For example, a similar link mechanism may also be provided to the upper rails 4b to control the ratio of open area of the air-cooling flow path.

Although one air-passage hole 2 is closed by a single shutter portion 5a in the above-described embodiment, one air-passage hole 2 may be closed by multiple slide plates. In this case, an engaging portion that engages with another slide plate may be provided in each of the multiple slide plates for sliding the slide plates such that the slide plates are overlapped with each other (like an accordion or a folding fan or sliding doors) by displacing one of the slide plates by a drive portion 9. This structure can increase the ratio of the opening area, and the cooling efficiency for the casing 3 can be increased.

Further, any types of a casing 3 and plug-in modules 1 can be used in the above-described embodiment and the modifications thereof. For example, if the casing 3 is a shelf or rack for a server apparatus or a disk array, plug-in modules 1 may be a CPU (central processing unit) module, a storage module, a power supply module, and the like. Alternatively, if the casing 3 is a chassis for a network communication apparatus, plug-in modules 1 may be interface modules and the like, which are compliant with a wide variety of communication standards.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A casing in which a module substrate is to be enclosed, wherein the casing comprising:
    a rail portion configured to receive and slidably support the module substrate;
    at least one shutter portion provided so as to open and close an opening for ventilation;
    a pin portion provided in the rail portion and configured to contact with an edge of the module substrate while the module substrate is supported by the rail portion; and
    a link mechanism that allows the shutter portion to move in accordance with the moving distance of the pin portion, the link mechanism including
        a lever portion that swings about a rotational shaft secured to the casing;
        a connector portion that links a first end of the lever portion to the pin portion, and rotates the lever portion in accordance with the moving distance of the pin portion; and
        a drive portion that links a second end of the lever portion to the shutter portion, and drives the shutter portion in accordance with the amount of rotation of the lever portion.

2. The casing according to claim 1, wherein the shutter portion is provided so as to be slidable with respect to the opening for ventilation, and
    the drive portion comprises a slider portion that transfers the moving distance in a slide direction among the amount of rotation of the lever portion to the shutter portion.

3. The casing according to claim 2, wherein the pin portion and the link mechanism are provided at a plurality of positions along a direction where the rail portion extends.

4. The casing according to claim 3, wherein the at least one shutter portion comprises a plurality of shutter portions, and
    each of the pin portions and the link mechanisms drive different shutter portion of the plurality of shutter portions.

5. The casing according to claim 1, wherein the shutter portion is provided so as to be rotatable about a shutter rotational shaft provided at one side of the opening, and
    the drive portion comprises a second connector portion that rotates the shutter portion, and a pair of universal joints provided at both ends of the second connector portion.

6. The casing according to claim 5, wherein the pin portion and the link mechanism are provided at a plurality of positions along a direction where the rail portion extends.

7. The casing according to claim 6, wherein the at least one shutter portion comprises a plurality of shutter portions, and
    each of the pin portions and the link mechanisms drive different shutter portion of the plurality of shutter portions.

8. The casing according to claim 1, wherein the pin portion and the link mechanism are provided at a plurality of positions along a direction where the rail portion extends.

9. The casing according to claim 8, wherein the at least one shutter portion comprises a plurality of shutter portions, and
    each of the pin portions and the link mechanisms drive different shutter portion of the plurality of shutter portions.

10. An air-cooling system, comprising:
a casing;
a module substrate mounted on the casing;
a shutter portion provided so as to open and close an opening formed in the casing;
a rail portion, provided in the casing, that slidably supports the module substrate;
a pin portion, provided in the rail portion, that contacts an edge of the module substrate when the module substrate is supported on the rail portion, and protrudes toward a recess formed in the module substrate; and
a link mechanism that drives the shutter portion in accordance with a moving distance of the pin portion.

* * * * *